United States Patent
Hsu et al.

(10) Patent No.: US 7,579,202 B2
(45) Date of Patent: Aug. 25, 2009

(54) METHOD FOR FABRICATING LIGHT EMITTING DIODE ELEMENT

(75) Inventors: Wen-Chieh Hsu, Taoyuan County (TW); Yu-Chuan Liu, Taoyuan County (TW); Jenn-Hwa Fu, Chiayi (TW); Shih-Hung Lee, Nantou County (TW); Tai-Chun Wang, Changhua County (TW)

(73) Assignee: Tekcore Co., Ltd., Nantou (TW)

( * ) Notice: Subject to any disclaimer, the term of this patent is extended or adjusted under 35 U.S.C. 154(b) by 88 days.

(21) Appl. No.: 11/963,580

(22) Filed: Dec. 21, 2007

(65) Prior Publication Data

US 2009/0162959 A1 Jun. 25, 2009

(51) Int. Cl.
*H01L 21/00* (2006.01)

(52) U.S. Cl. .............. 438/33; 438/34; 438/41; 438/751; 438/945; 257/E21.306; 257/E21.034; 257/E21.117

(58) Field of Classification Search .......... 438/33, 438/34, 751, 945, 950, 37, 40, 41, 42, 440; 257/E21.108, E21.117, E21.103, E21.7, E21.131, 257/E21.037, E21.306, E21.025, E21.034
See application file for complete search history.

(56) References Cited

U.S. PATENT DOCUMENTS

| | | | |
|---|---|---|---|
| 6,025,251 A * | 2/2000 | Jakowetz et al. | 438/464 |
| 6,229,160 B1 | 5/2001 | Krames et al. | |
| 6,570,190 B2 | 5/2003 | Krames et al. | |
| 7,122,395 B2 * | 10/2006 | Gogoi | 438/48 |
| 2005/0076830 A1* | 4/2005 | Motoki et al. | 117/92 |
| 2005/0092234 A1* | 5/2005 | Motoki et al. | 117/91 |
| 2005/0156180 A1* | 7/2005 | Zhang et al. | 257/79 |
| 2006/0033119 A1* | 2/2006 | Shibata | 257/103 |
| 2007/0166851 A1* | 7/2007 | Tran et al. | 438/22 |
| 2008/0014723 A1* | 1/2008 | Shibata | 438/478 |

* cited by examiner

*Primary Examiner*—Caridad M Everhart
(74) *Attorney, Agent, or Firm*—Muncy, Geissler, Olds & Lowe, PLLC

(57) ABSTRACT

The present invention discloses a method for fabricating a light emitting diode element, which incorporates an epitaxial process with an etching process to etch LED epitaxial layers bottom up and form side-protrudent structures, whereby the LED epitaxial layers have non-rectangular inclines, which can solve the problem of total reflection and promote light-extraction efficiency. Further, the method of the present invention has a simple fabrication process, which can benefit mass production and lower cost.

18 Claims, 13 Drawing Sheets

METHOD FOR FABRICATING LIGHT EMITTING DIODE ELEMENT

FIELD OF THE INVENTION

The present invention relates to a method for fabricating a light emitting diode element, particularly to a method for fabricating a high light-extraction efficiency light emitting diode element.

BACKGROUND OF THE INVENTION

Traditionally, a light emitting diode (LED) is fabricated into a parallelepiped shape. As there is a great difference between the refractive indexes of air/packaging material and a common LED, light emitted by LED is apt to be totally reflected in an LED-air or LED-packaging material interface. Therefore, light generated by LED reaching an interface by an angle greater than the total reflection critical angle will be totally reflected back to the interior of the LED chip. Besides, the parallel faces of a parallelepiped decrease the probability that light leaves an LED chip from an interface. Thus, photons can only be totally reflected inside the LED chip until they are completely absorbed and converted into heat. Therefore, LED usually has insufficient light efficiency.

Conventionally, GaN (Gallium Nitride) LED is grown on an insulating aluminum oxide substrate. An LED epitaxial layer should be etched until the n-type semiconductor is reached before the N-type electrode is formed. As the bonding energy of a GaN LED epitaxial layer is very high, it is hard to etch with a wet etching method. Therefore, a dry etching method is usually used to etch GaN LED. In the current dry etching technology, the effect of physical etching exceeds that of chemical etching; consequently, dry etching often forms a parallelepiped shape.

Changing LED shape is an effective approach to improve LED light efficiency. U.S. Pat. No. 6,229,160 disclosed a "Truncated Inverted Pyramid (TIP)" LED, wherein four faces of an AlGaInP/GaP LED chip are mechanically fabricated to be no more parallel to each other. Thus, light can be effectively extracted from LED. Thereby, the external quantum efficiency thereof is greatly increased to 55%, and the light efficiency thereof can reach as high as 1001 m/w. The TIP LED is the first LED achieving the abovementioned standard. However, the technology of TIP LED can only apply to red light AlGaInP/GaP LED chips. A GaN LED is epitaxially grown on a sapphire substrate, which is very hard to mechanically fabricate. Therefore, the TIP LED technology cannot apply to GaN LED.

U.S. Pat. No. 6,570,190 disclosed a "LED having angled sides for increased side light extraction", whereby the external quantum efficiency thereof is greatly promoted. As the bonding energy of a GaN LED is very high, it is hard to obtain angles having special crystallographic directions via etching. If a pure chemical etching process is used, it cannot obtain any inclined faces even.

SUMMARY OF THE INVENTION

The present invention proposes a method for fabricating a light emitting diode (LED) element, wherein an epitaxial method and an etching method cooperates to form a LED epitaxial layer with non-rectangular inclines to overcome the problem of total reflection and promote light-extraction efficiency.

The present invention proposes a method for fabricating a high light-extraction LED element, which comprises steps: (a) providing a substrate, forming a mask layer on the substrate with the mask layer having a plurality of rectangles exposing epitaxial regions on the substrate, wherein the substrate is made of sapphire, silicon carbide (SiC), silicon (Si), gallium arsenide (GaAs) or aluminum nitride (AlN), and wherein the mask layer is made of silicon dioxide ($SiO_2$), silicon nitride (SiN), nickel (Ni), chromium (Cr), platinum (Pt), titanium (Ti), or a photoresist; (b) forming a LED epitaxial layer on the epitaxial regions, and forming a separating slit on the LED epitaxial layer and between each two epitaxial regions; (c) forming an etch-mask layer on the LED epitaxial layer; (d) letting a wet-etching solution permeate through the separating slits to etch the mask layers and the LED epitaxial layers bottom up to form side-protrudent structures, wherein the wet-etching solution is heated to between 50° C. and 350° C.; the wet-etching solution is a mixture of sulfuric acid ($H_2SO4$) and phosphoric acid ($H_3PO_4$), or a mixture of potassium hydroxide (KOH)/phosphoric acid ($H_3PO_4$) and glycol; (e) removing the etch-mask layer, and forming a transparent electrically-conductive layer on the LED epitaxial layer; (f) etching the transparent electrically-conductive layer and the LED epitaxial layer to form a contact region, and forming an n-type ohmic contact electrode on the contact region and a p-type ohmic contact electrode on the transparent electrically-conductive layer, which are used to provide a driving current for the LED epitaxial layer; and (g) grinding the substrate, and cutting and splitting the ground substrate into LED elements.

Further, a plurality of protrusions made of the material of the mask layer may be formed on the epitaxial regions. The protrusions are in a form of parallel strips, or in a form of an array of rectangles, circles or polygons. A wet-etching solution is used to etch the bottom of the LED epitaxial layer to make the bottom of the LED epitaxial layer form a rugged surface for light scattering or light diffraction. Thereby, the external quantum efficiency thereof is increased, and a high light-extraction efficiency structure is achieved.

Besides, in Step (a), the substrate may be etched to form slots to replace the mask layers, and the slots define a plurality of rectangular epitaxial regions on the substrate. The substrate is further etched to form a plurality of recesses on the epitaxial regions; the recesses are in a form of parallel strips, or in a form of an array of rectangles, circles or polygons. A wet-etching solution is used to etch the bottom of the LED epitaxial layer to make the bottom of the LED epitaxial layer form a rugged surface.

The present invention also proposes another method for fabricating a high light-extraction LED element, which comprises steps: (a) providing a substrate, and forming a plurality of protrusions arranged equidistantly; (b) forming an LED epitaxial layer on the substrate; (c) forming an etch-mask layer on the LED epitaxial layer; (d) cutting the etch-mask layer and the LED epitaxial layer till the surface of the substrate with a laser to form separating slits, which separate the LED epitaxial layer into rectangles; (e) letting a wet-etching solution permeate through the separating slits to etch the LED epitaxial layers and the protrusions bottom up to form side-protrudent structures and rugged bottom surfaces of the LED epitaxial layers; (f) removing the etch-mask layer, and forming a transparent electrically-conductive layer on the LED epitaxial layer; (g) etching the transparent electrically-conductive layer and the LED epitaxial layer to form a contact region, and forming an n-type ohmic contact electrode on the contact region and a p-type ohmic contact electrode on the transparent electrically-conductive layer, which are used to provide a driving current for the LED epitaxial layer; and (h) grinding the substrate, and cutting and splitting the ground substrate into LED elements.

In Step (a), the substrate may be etched to form a plurality of recesses arranged equidistantly to replace the protrusions. The recesses is in a form of parallel strips, or in a form of an array of rectangles, circles or polygons.

The present invention is characterized in and benefited from incorporating an epitaxial process with an etching process to etch the LED epitaxial layers bottom up and form side-protrudent structures, whereby the LED epitaxial layers have non-rectangular inclines, which can solve the problem of total reflection and promote light-extraction efficiency. Further, the method of the present invention has a simple fabrication process, which can benefit mass production and lower cost.

DETAILED DESCRIPTION OF THE PREFERRED EMBODIMENTS

The technical contents of the present invention are to be described in detail with embodiments. However, these embodiments are only to demonstrate the present invention but not to limit the scope of the present invention.

The present invention utilizes an epitaxial method and an etching method to form an LED epitaxial layer with non-rectangular inclines to overcome the total-reflection problem and achieve a high light-extraction efficiency LED.

Figure 1:
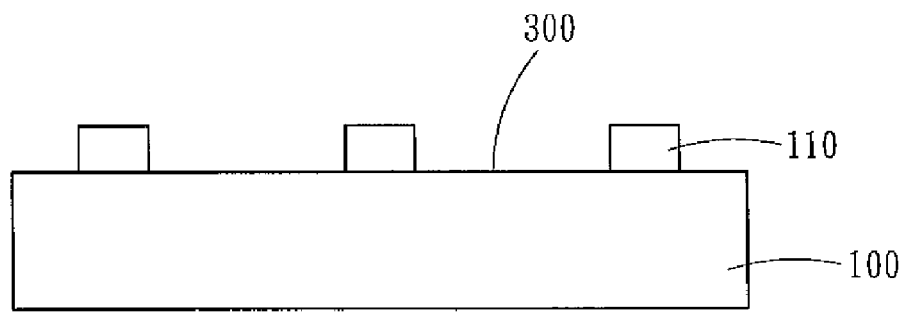
FIG. 1 to FIG. 7 are diagrams schematically showing the process of the method according to a first embodiment of the present invention.
Figure 2:
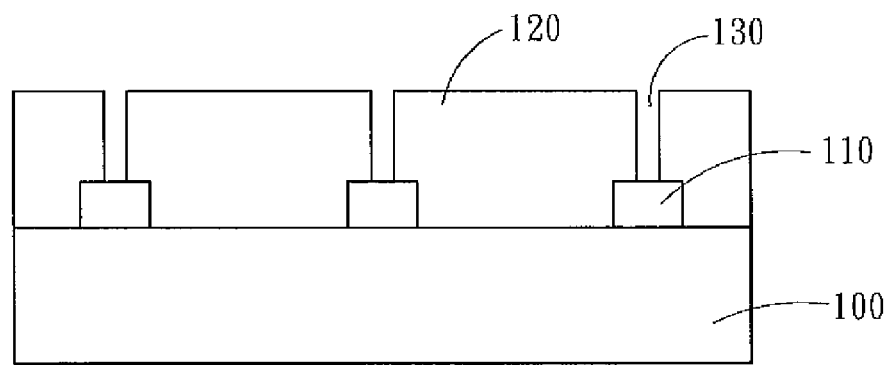

Refer to from FIG. 1 to FIG. 7 diagrams schematically showing the process of the method according to a first embodiment of the present invention. According to the first embodiment of the present invention, the method comprises steps:

(a) providing a substrate 100, forming a mask layer 110 on the substrate 100, and etching the mask layer 110 to define a plurality of epitaxial regions 300, which have a rectangular shape and expose the surface of the substrate 100, as shown in FIG. 1, wherein the substrate 100 is made of sapphire, silicon carbide (SiC), silicon (Si), gallium arsenide (GaAs) or aluminum nitride (AlN), and wherein the mask layer 110 is made of silicon dioxide ($SiO_2$), silicon nitride (SiN), nickel (Ni), chromium (Cr), platinum (Pt), titanium (Ti), or a photoresist, (b) forming a LED epitaxial layer 120 on the epitaxial regions 300, and forming a separating slit 130 on the LED epitaxial layer 120 and between each two epitaxial regions 300, as shown in FIG. 2; (In the present invention, the LED epitaxial layer 120 grows on the substrate 100 except the mask layer 110, but the epitaxial layer will laterally grow onto the mask layer 110; via selecting an appropriate size of the mask layer 110 and adjusting the condition of epitaxial growth, the case shown in FIG. 2 will appear.)

Figure 3:
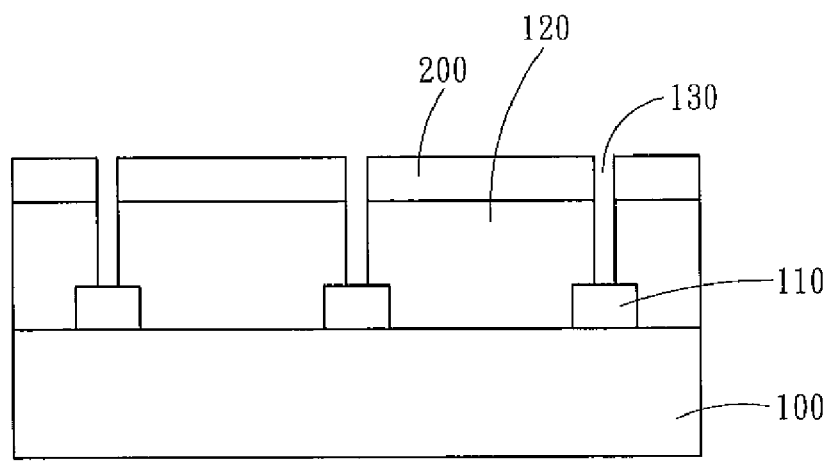
Figure 4:
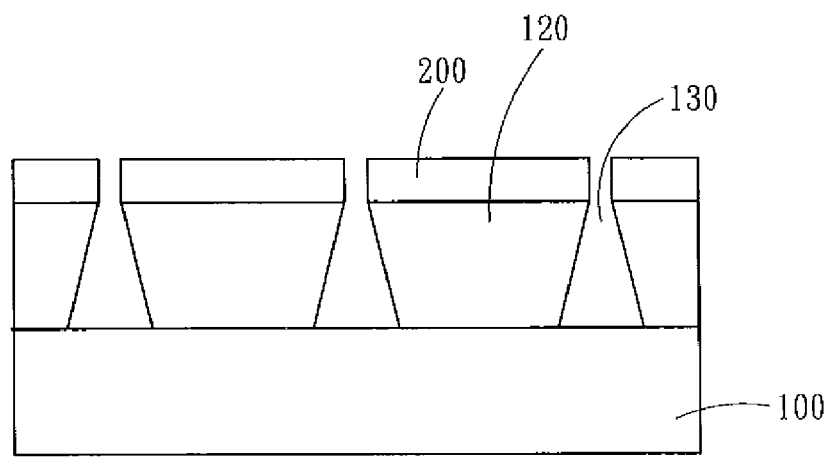

(c) forming an etch-mask layer 200 on the LED epitaxial layer 120, as shown in FIG. 3, wherein the etch-mask layer 200 is made of silicon dioxide ($SiO_2$);

(d) letting a wet-etching solution permeate through the separating slits 130 to etch the mask layers 110 and the LED epitaxial layers 120 bottom up to form side-protrudent structures, as shown in FIG. 4, wherein the wet-etching solution is heated to between 50° C. and 350° C.; the wet-etching solution is a mixture of sulfuric acid ($H_2SO4$) and phosphoric acid ($H_3PO_4$), or a mixture of potassium hydroxide (KOH)/phosphoric acid ($H_3PO_4$) and glycol; (The LED epitaxial layer 120 is made of a GaN-based material. A Ga phase, which is hard to wet-etch, dominates the surface of the LED epitaxial layer 120. However, the LED epitaxial layer 120 has an N phase-rich bottom layer, which is easier to be etched by the wet-etching solution permeating through the separating slits 130. Thus, non-rectangular angles are formed.)

Figure 5:
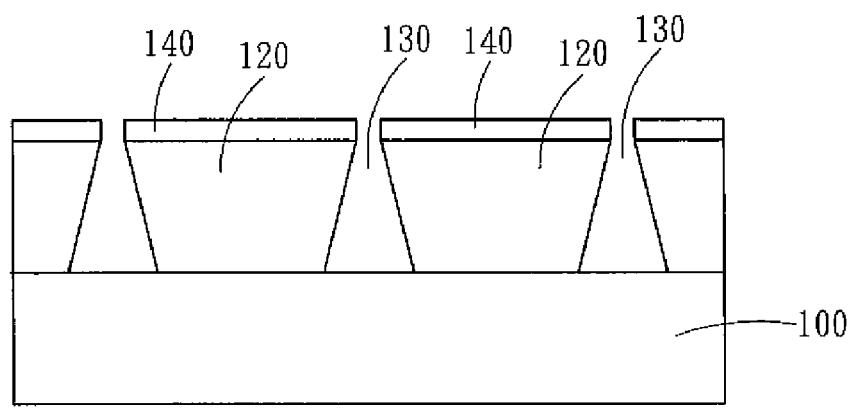
Figure 6:
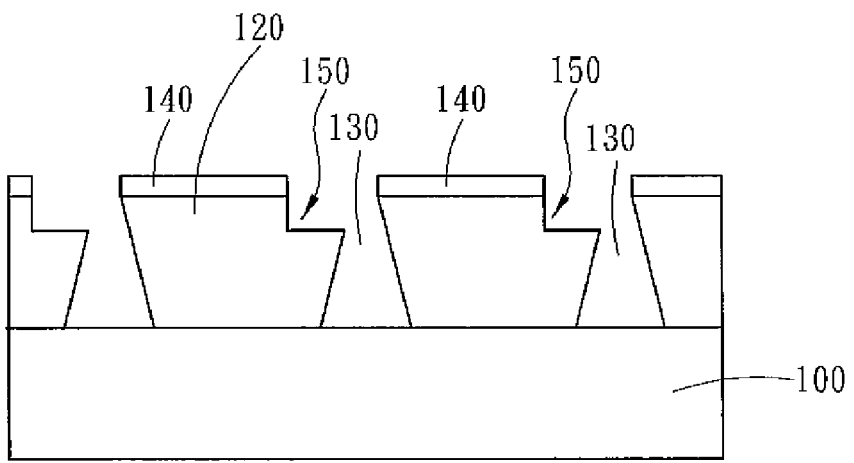
Figure 7:
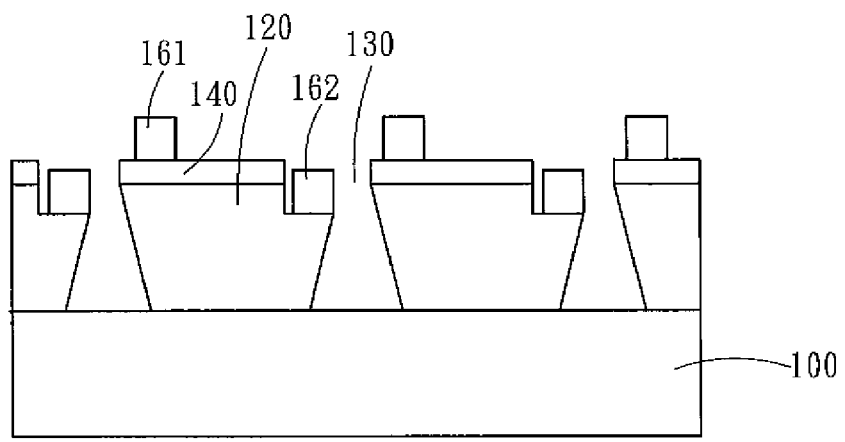

(e) removing the etch-mask layer 200, and forming a transparent electrically-conductive layer 140 on the LED epitaxial layer 120, as shown in FIG. 5, wherein the transparent electrically-conductive layer 140 is made of ITO (Indiun-Tin-Oxide), IZO (Indium-Zinc-Oxide), or AZO (Aluminum-Zinc-Oxide);

(f) etching the transparent electrically-conductive layer 140 and the LED epitaxial layer 120 to form a contact region 150, as shown in FIG. 6, and forming an n-type ohmic contact electrode 162 on the contact region 150 and a p-type ohmic contact electrode 161 on the transparent electrically-conductive layer 140, which are used to provide a driving current for the LED epitaxial layer 120, as shown in FIG. 7; and (g) grinding the substrate 100, and cutting and splitting the ground substrate 100 into LED elements.

Figure 8:
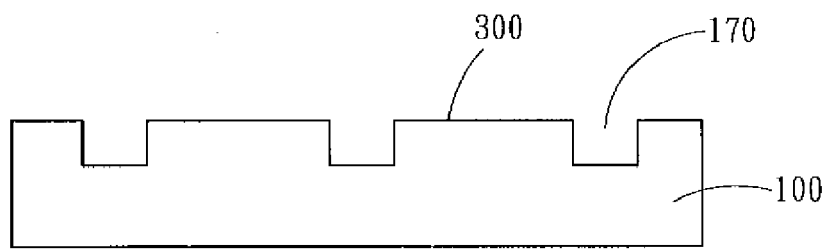
FIG. 8 to FIG. 11 are diagrams schematically showing the process of the method according to a second embodiment of the present invention.
Figure 9:
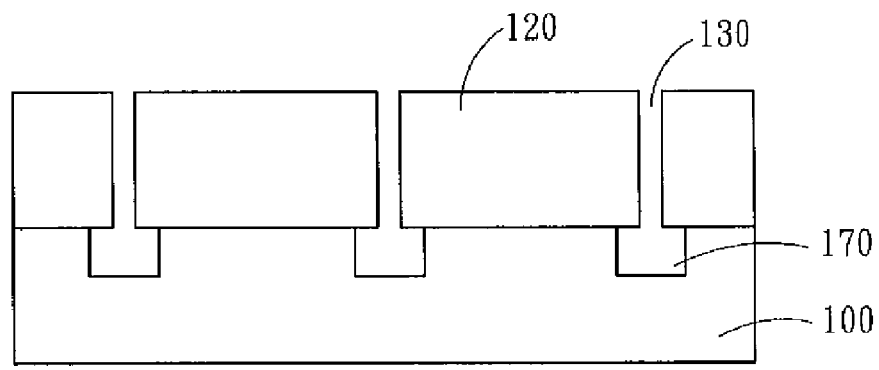

Refer to from FIG. 8 to FIG. 11 diagrams schematically showing the process of the method according to a second embodiment of the present invention. The method of the second embodiment is basically similar to that of the first embodiment. However, slots 170, which are formed via etching, replace the mask layers 110 in Step (a). The slots 170 also define a plurality of epitaxial regions 300, as shown in FIG. 8. An LED epitaxial layer 120 is grown on the substrate 100 except the slots 170, but the epitaxial layer will laterally grow over the slots 170. Via selecting an appropriate size of the slots 170 and adjusting the condition of epitaxial growth, a separating slit 130 will be formed on the LED epitaxial layer 120 and between each two epitaxial regions 300, as shown in FIG. 9.

Figure 10:
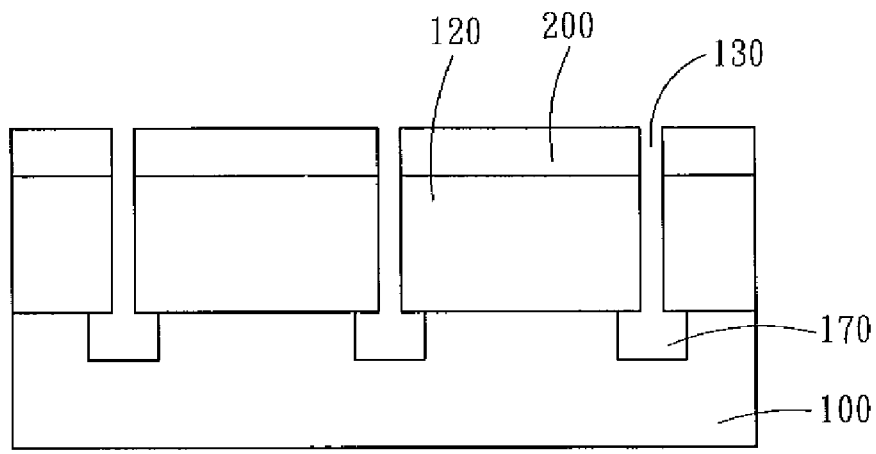
Figure 11:
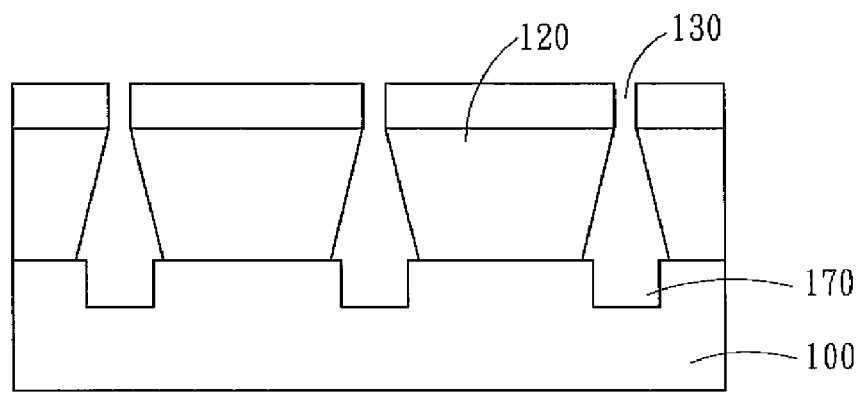
Figure 12:
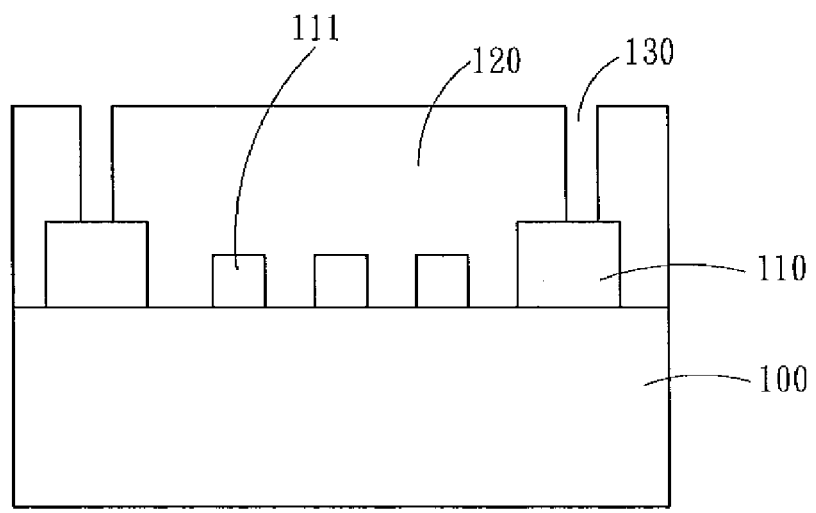
FIG. 12 to FIG. 18 are diagrams schematically showing the process of the method according to a third embodiment of the present invention.

Next, an etch-mask layer 200 is formed on the LED epitaxial layer 120, as shown in FIG. 10. Next, the LED epitaxial layers 120 is bottom up etched with a wet-etching solution, which permeates through the separating slits 130, to form side-protrudent structures, as shown in FIG. 11.

Figure 13:
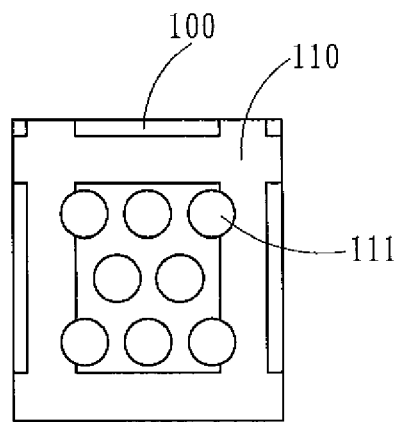
Figure 14:
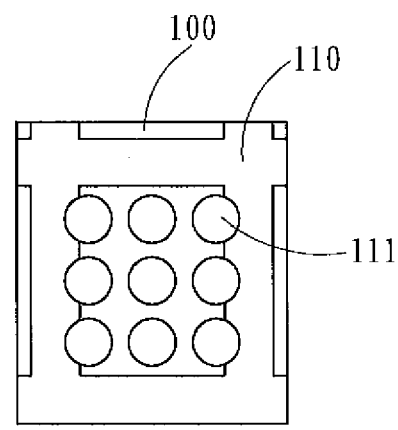
Figure 15:
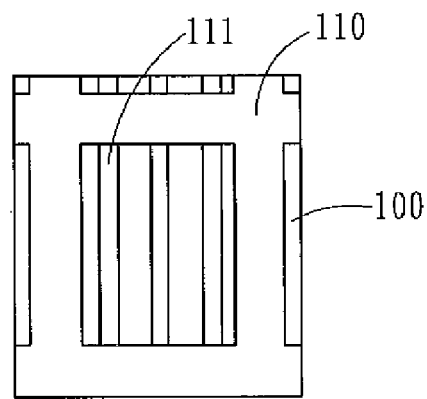
Figure 16:
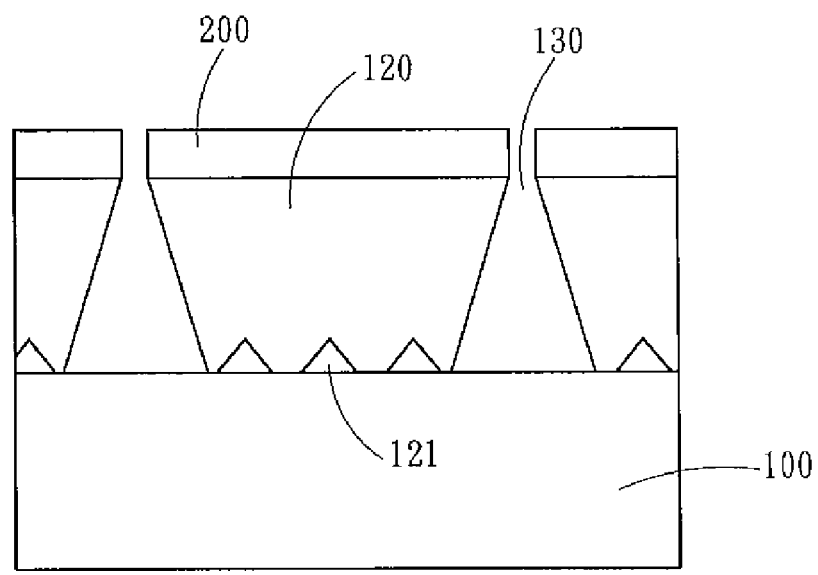

The succeeding steps are similar to those of the first embodiment. The etch-mask layer 200 is removed, and a transparent electrically-conductive layer 140 is formed on the LED epitaxial layer 120. Next, the transparent electrically-conductive layer 140 and the LED epitaxial layer 120 are etched to form a contact region 150, Next, an n-type ohmic contact electrode 162 is formed on the contact region 150, and a p-type ohmic contact electrode 161 is formed on the transparent electrically-conductive layer 140, and both electrodes are used to provide a driving current for the LED epitaxial layer 120. Then, the substrate 100 is ground, and the ground substrate 100 is cut and split into LED elements. Refer to from FIG. 12 to FIG. 18 diagrams schematically showing the process of the method according to a third embodiment of the present invention. The method of the third embodiment is basically similar to that of the first embodiment. However, in Step (a), a plurality of protrusions 111 made of the material of the mask layer 110 is formed on the epitaxial regions 300. The protrusions 111 may be in a form of parallel strips, as shown in FIG. 15. The protrusions 111 may also in a form of an array of rectangles, circles or polygons, and FIG. 13 and FIG. 14 show exemplifications of circle arrays. Next, the LED epitaxial layer 120 is grown on the substrate 100 except the mask layer 110. Similarly, a separating slit 130 will be formed on the LED epitaxial layer 120 and between each two epitaxial regions 300. Next, an etch-mask layer 200 is formed on the LED epitaxial layer 120. Next, the LED epitaxial layers 120 is bottom up etched with a wet-etching solution, which permeates through the separating slits 130, to form side-protrudent structures. Further, the wet-etching solution also etches the protrusions 111 on the bottom of the LED epitaxial layer 120. Thus, the bottom of the LED epitaxial layer 120 becomes a rugged surface 121, as shown in FIG. 16. The rugged surface 121 can enable the scattering or diffraction of the light emitted by LED. Thereby, the external quantum efficiency thereof is increased, and a high light-extraction efficiency structure is achieved.

Figure 17:
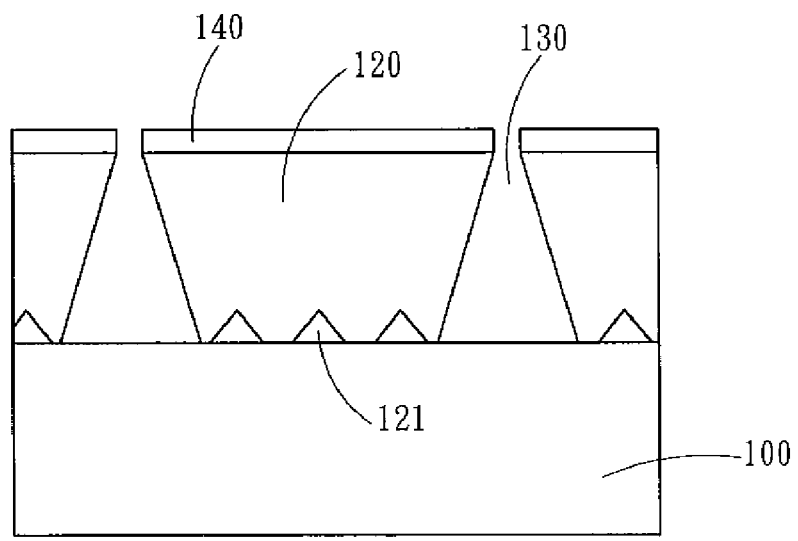
Figure 18:
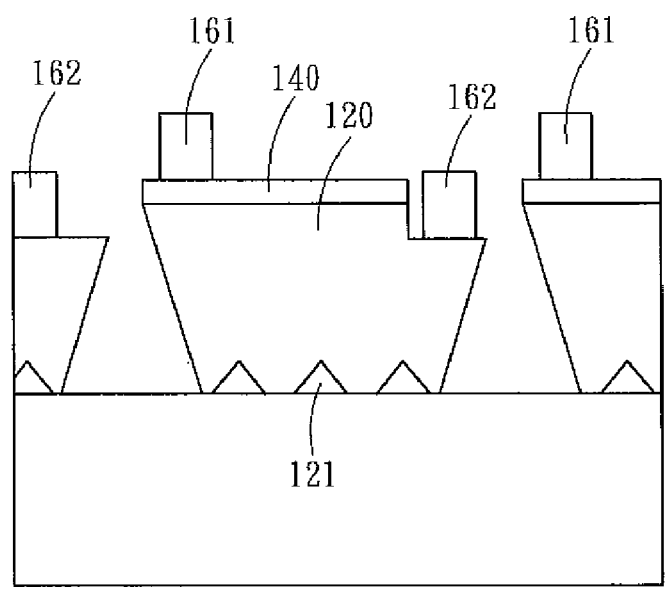
Figure 19:
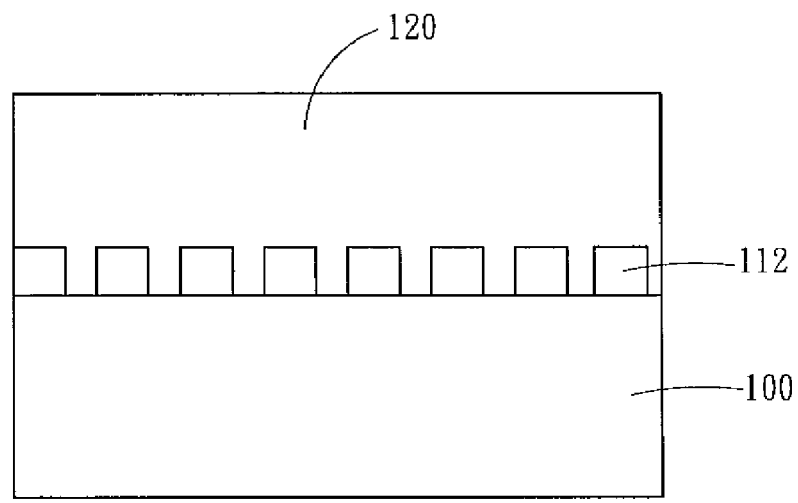
FIG. 19 to FIG. 25 are diagrams schematically showing the process of the method according to a fourth embodiment of the present invention.

The succeeding steps are similar to those of the first embodiment. The etch-mask layer 200 is removed, and a transparent electrically-conductive layer 140 is formed on the LED epitaxial layer 120, as shown in FIG. 17. Next, the transparent electrically-conductive layer 140 and the LED epitaxial layer 120 are etched to form a contact region 150. Next, an n-type ohmic contact electrode 162 is formed on the contact region 150, and a p-type ohmic contact electrode 161 is formed on the transparent electrically-conductive layer 140, and both electrodes are used to provide a driving current for the LED epitaxial layer 120, as shown in FIG. 18. Then, the substrate 100 is ground, and the ground substrate 100 is cut and split into LED elements.

The principle of the third embodiment can also apply to the second embodiment. A plurality of recesses is formed on the epitaxial regions 300 via etching. The recesses may be in a form of parallel strips or in a form of an array of rectangles, circles or polygons. A wet-etching solution is also used to etch the bottom of the LED epitaxial layer 120. Thus, the bottom of the LED epitaxial layer 120 becomes a rugged surface 121.

Figure 20:
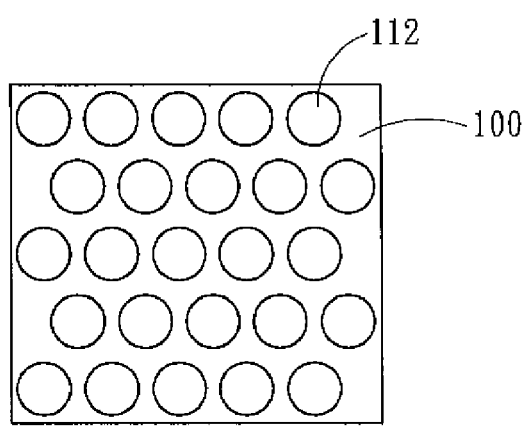
Figure 21:
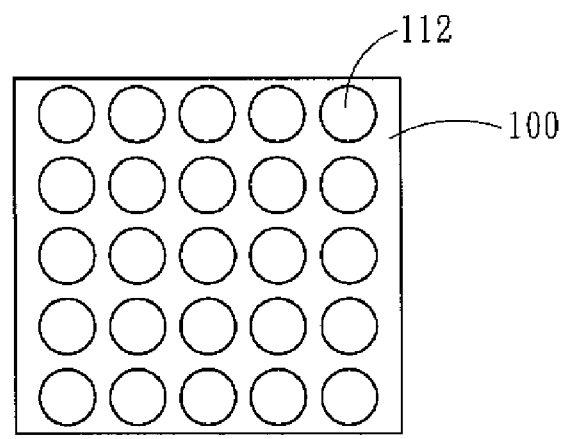
Figure 22:
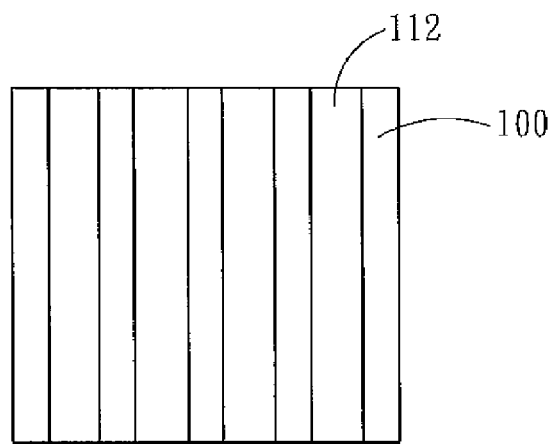
Figure 23:
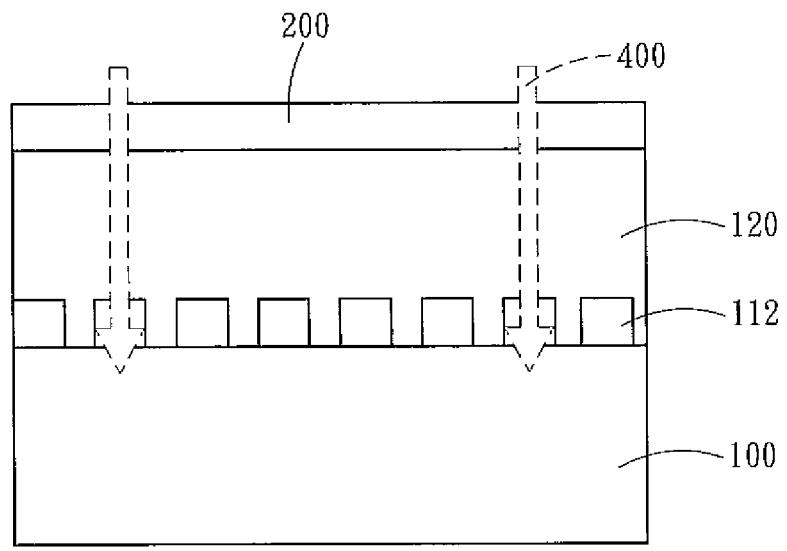
Figure 24:
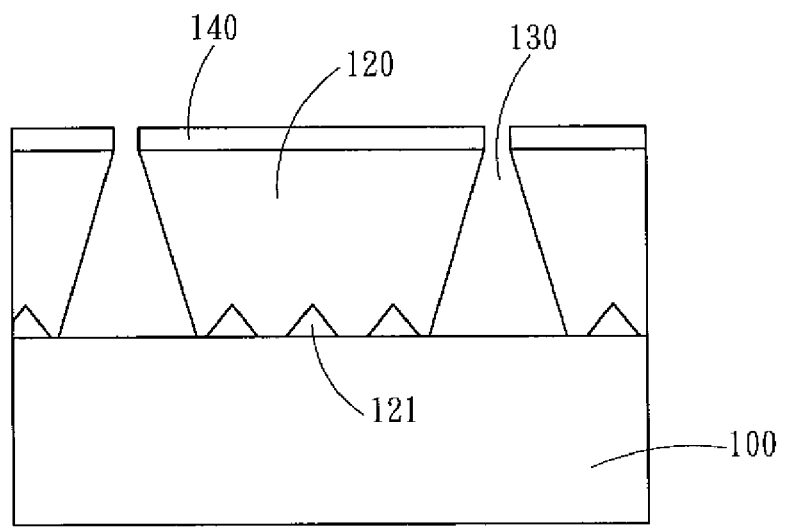
Figure 25:
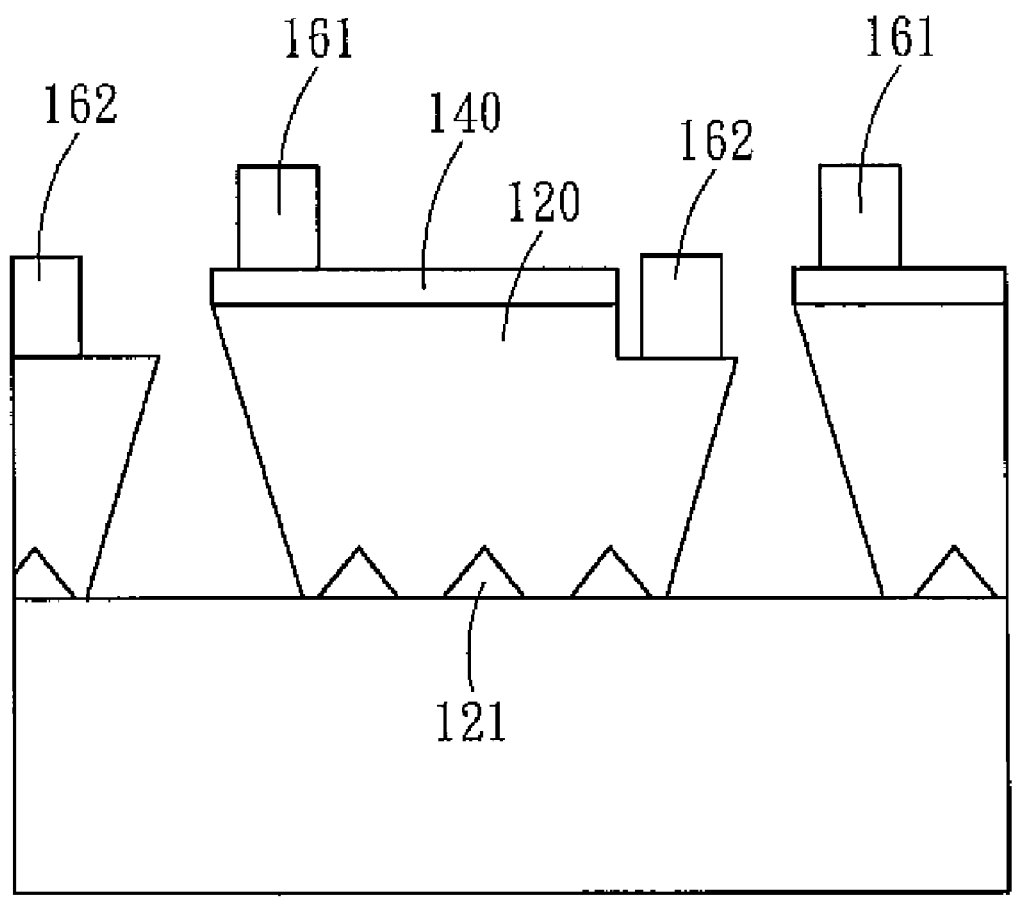

Refer to from FIG. 19 to FIG. 25 diagrams schematically showing the process of the method according to a fourth embodiment of the present invention. According to the fourth embodiment of the present invention, the method comprises steps:

(a) providing a substrate 100, and forming a plurality of protrusions 112 arranged equidistantly, wherein the protrusions 112 is made of silicon dioxide ($SiO_2$), and the protrusions 112 may be in a form of an array of rectangles, circles or polygons (FIG. 20 and FIG. 21 show exemplifications of circle arrays); the protrusions 112 may also be in a form of parallel strips (shown in FIG. 22); (b) forming a LED epitaxial layer 120 on the substrate 100; (c) forming an etch-mask layer 200 on the LED epitaxial layer 120; (d) cutting the etch-mask layer 200 and the LED epitaxial layer 120 till the surface of the substrate 100 with a laser 400 to form separating slits 130, which separate the LED epitaxial layer 120 into rectangles, as shown in FIG. 23; (e) letting a wet-etching solution permeate through the separating slits 130 to etch the LED epitaxial layers 120 and the protrusions 112 bottom up to form side-protrudent structures and rugged bottom surfaces 121 of the LED epitaxial layers 120, as shown in FIG. 24; (f) removing the etch-mask layer 200, and forming a transparent electrically-conductive layer 140 on the LED epitaxial layer 120; (g) etching the transparent electrically-conductive layer 140 and the LED epitaxial layer 120 to form a contact region 150, and forming an n-type ohmic contact electrode 162 on the contact region 150 and a p-type ohmic contact electrode 161 on the transparent electrically-conductive layer 140, which are used to provide a driving current for the LED epitaxial layer 120, as shown in FIG. 25; and (h) grinding the substrate 100, and cutting and splitting the ground substrate 100 into LED elements.

In Step (a) of this embodiment, the substrate 100 may also be etched to form a plurality of recesses arranged equidistantly to replace the protrusions 112.

The present invention is characterized in and benefited from incorporating an epitaxial process with an etching process to etch the LED epitaxial layers 120 bottom up and form side-protrudent structures, whereby the LED epitaxial layers 120 have non-rectangular inclines, which can solve the problem of total reflection and promote light-extraction efficiency. Further, the method of the present invention has a simple fabrication process, which can benefit mass production and lower cost.

Those described above are only the preferred embodiments to exemplify the present invention but not to limit the scope of the present invention. Any equivalent modification or variation according to the spirit of the present invention is to be also included within the scope of the present invention.

What is claimed is:

1. A method for fabricating a light emitting diode element comprising steps:
    (a) providing a substrate, forming a mask layer on said substrate with said mask layer having a plurality of rectangles exposing epitaxial regions on said substrate;
    (b) forming a LED (Light Emitting Diode) epitaxial layer on said epitaxial regions, and forming a separating slit on said LED epitaxial layer and between each two said epitaxial regions;
    (c) forming an etch-mask layer on said LED epitaxial layer;
    (d) letting a wet-etching solution permeate through said separating slits to etch said mask layers and said LED epitaxial layers bottom up to form side-protrudent structures;
    (e) removing said etch-mask layer, and forming a transparent electrically-conductive layer on said LED epitaxial layer;
    (f) etching said transparent electrically-conductive layer and said LED epitaxial layer to form a contact region, and forming an n-type ohmic contact electrode on said contact region and a p-type ohmic contact electrode on said transparent electrically-conductive layer, which are used to provide a driving current for said LED epitaxial layer; and
    (g) grinding, cutting and splitting said substrate into LED elements.

2. The method for fabricating the light emitting diode element according to claim 1, wherein said substrate is made of sapphire, silicon carbide (SiC), silicon (Si), gallium arsenide (GaAs) or aluminum nitride (AlN).

3. The method for fabricating the light emitting diode element according to claim 1, wherein said mask layer is made of silicon dioxide ($SiO_2$), silicon nitride (SiN), or a photoresist.

4. The method for fabricating the light emitting diode element according to claim 1, wherein said mask layer is made of nickel (Ni), chromium (Cr), platinum (Pt), or titanium (Ti).

5. The method for fabricating the light emitting diode element according to claim 1, wherein said wet-etching solution is heated to between 50° C. and 350° C.; said wet-etching solution is a mixture of sulfuric acid ($H_2SO4$) and phosphoric acid ($H_3PO_4$), or a mixture of potassium hydroxide (KOH)/ phosphoric acid ($H_3PO_4$) and glycol.

6. The method for fabricating the light emitting diode element according to claim 1, wherein a plurality of protrusions made of the material of said mask layer is formed on said epitaxial regions; said wet-etching solution etches the bottom of said LED epitaxial layer to make the bottom of said LED epitaxial layer become a rugged surface.

7. The method for fabricating the light emitting diode element according to claim 6, wherein said protrusions is in a form of parallel strips, or in a form of an array of rectangles, circles or polygons.

8. The method for fabricating the light emitting diode element according to claim 1, wherein in said Step (a), said substrate is etched to form slots to replace said mask layers, and said slots define a plurality of rectangular said epitaxial regions on said substrate.

9. The method for fabricating the light emitting diode element according to claim 8, wherein said substrate is etched to form a plurality of recesses on said epitaxial regions; said wet-etching solution etches the bottom of said LED epitaxial layer to make the bottom of said LED epitaxial layer become a rugged surface.

10. The method for fabricating the light emitting diode element according to claim 9, wherein said recesses is in a form of parallel strips, or in a form of an array of rectangles, circles or polygons.

11. A method for fabricating a light emitting diode element comprising steps:
    (a) providing a substrate, and forming a plurality of protrusions arranged equidistantly;
    (b) forming a LED epitaxial layer on said substrate;
    (c) forming an etch-mask layer on said LED epitaxial layer;
    (d) cutting said etch-mask layer and said LED epitaxial layer till the surface of said substrate with a laser to form separating slits, which separate said LED epitaxial layer into rectangles;
    (e) letting a wet-etching solution permeate through said separating slits to etch said LED epitaxial layers and said protrusions bottom up to form side-protrudent structures and rugged bottom surfaces of said LED epitaxial layers;
    (f) removing said etch-mask layer, and forming a transparent electrically-conductive layer on said LED epitaxial layer;
    (g) etching said transparent electrically-conductive layer and said LED epitaxial layer to form a contact region, and forming an n-type ohmic contact electrode on said contact region and a p-type ohmic contact electrode on said transparent electrically-conductive layer, which are used to provide a driving current for said LED epitaxial layer; and
    (h) grinding, cutting and splitting said substrate into LED elements.

12. The method for fabricating the light emitting diode element according to claim 11, wherein said substrate is made of sapphire, silicon carbide (SiC), silicon (Si), gallium arsenide (GaAs) or aluminum nitride (AlN).

13. The method for fabricating the light emitting diode element according to claim 11, wherein said protrusion is made of silicon dioxide ($SiO_2$), silicon nitride (SiN), or a photoresist.

14. The method for fabricating the light emitting diode element according to claim 11, wherein said protrusion is made of nickel (Ni), chromium (Cr), platinum (Pt), or titanium (Ti).

15. The method for fabricating the light emitting diode element according to claim 11, wherein said protrusions is in a form of parallel strips, or in a form of an array of rectangles, circles or polygons.

16. The method for fabricating a light emitting diode element according to claim 11, wherein said wet-etching solution is heated to between 50° C. and 350° C.; said wet-etching solution is a mixture of sulfuric acid ($H_2SO4$) and phosphoric acid ($H_3PO_4$), or a mixture of potassium hydroxide (KOH)/ phosphoric acid ($H_3PO_4$) and glycol.

17. The method for fabricating the light emitting diode element according to claim 11, wherein in said Step (a), said substrate is etched to form recesses arranged equidistantly to replace said protrusions.

18. The method for fabricating the light emitting diode element according to claim 17, wherein said recesses is in a form of parallel strips, or in a form of an array of rectangles, circles or polygons.

* * * * *